United States Patent [19]

Goldsmith et al.

[11] Patent Number: 5,876,795
[45] Date of Patent: Mar. 2, 1999

[54] METHOD FOR PRODUCING A LOW-STRESS ELECTROLESSLY DEPOSITED NICKEL LAYER

[75] Inventors: Charles Curtis Goldsmith, Poughkeepsie; Thomas Lester Nunes, Wappingers Falls, both of N.Y.

[73] Assignee: International Business Machines Corporation, Armonk, N.Y.

[21] Appl. No.: 861,473

[22] Filed: May 21, 1997

[51] Int. Cl.$^6$ ...................................................... B05D 3/02
[52] U.S. Cl. ...................... 427/226; 427/377; 427/383.5; 427/405; 427/438
[58] Field of Search ................................... 427/226, 377, 427/383.5, 438, 405

[56] References Cited

U.S. PATENT DOCUMENTS 4,055,706 10/1977 Galmiche et al. ...................... 428/652
4,407,860 10/1983 Fleming et al. ........................... 427/98

Primary Examiner—Brian K Talbot
Attorney, Agent, or Firm—H. Daniel Schnurmann

[57] ABSTRACT

A process for producing a low-stress electrolessly deposited layer of nickel yielding a clean nickel film and having a wettable surface is described. Diffusion is performed in a non-oxidizing environment, using a gas mixture containing nitrogen. The diffusion temperature is optimally set at a temperature of at least 500° C., i.e., at least 150° C. below typical prior art diffusion temperatures. The presence of nitrogen during diffusion changes the direction of the outgoing born away from the surface of the film, and eliminates the requirement that the nickel film be plated on refractory metal that contains glass, which was previously required to provide a media for the boron to diffuse into it for its subsequent removal.

14 Claims, 5 Drawing Sheets

METHOD FOR PRODUCING A LOW-STRESS ELECTROLESSLY DEPOSITED NICKEL LAYER

FIELD OF THE INVENTION

This invention relates to a process for diffusing electrolessly plated nickel and related metals and alloys, and more particularly to an improved process for removing boron from a nickel layer deposited in an amine-boron autocatalytic bath.

BACKGROUND OF THE INVENTION

In the semiconductor fabrication technology, it is necessary to selectively plate certain areas of a substrate, particularly, in high level packages upon which integrated circuit chips are to be mounted thereon. One example of such high level packages is a multilayer ceramic module which, typically, provides the necessary interchip connections as well as the redistribution of I/Os to enable the connections to cards, boards, and the like. Substrates of this type are built with green ceramic sheets, such as those known in the industry as 9211, having connecting patterns that provide the internal interconnection metallurgy system, and which have been punched with a plurality of via holes. Whereas interconnecting lines and patterns are made of standard conductive materials, such as Al, the metallurgy of the via holes is typically made of screened refractory metals, such as W, Mo, Ta, Ti, Mn, and the like, to allow co-firing of the ceramic and the metallurgy. These materials are capable of withstanding the high temperatures necessary for sintering the green sheets forming the ceramic substrate.

Prior to sintering, the green sheets are stacked on top of each other, such that via holes filled with conductive material, (preferably, with refractory metal) in one sheet match corresponding vias in another. Ultimately, an interconnecting or redistribution line in one sheet will find its way to the top (or bottom) surface with the help of the interconnected vias. The exposed screened and sintered refractory metal area at the uppermost (or lowermost) layer must then be capped with metal that can be brazed or soldered to allow affixing module pins (if at the bottom layer) or to make the necessary connections with C4 balls or solder bumps of chips mounted on the substrate. Vias filled with W, Mo, and the like, are not wettable with braze or solder, hence the metal requires a layer of metal that can be soldered or brazed on the surface for further interconnection to the card or module.

The plating process typically includes a plating bath that contains ions of the metal to be deposited along with an auto-catalytic chemical reducing agent for the metal ions, and deposits the metal in a layer by reducing the metal ions within the solution. Typical reducing agents include hypophosphite ions, most commonly used for nickel chloride in an acid solution or amine boron as a reducing agent. The nickel layer will then contain traces of phosphorous in the former example, and boron in the latter. These residues have an adverse effect in that they can cause reliability problems by introducing stresses within the metal layer and severely impact the wettability of the surface, negatively impacting the ulterior brazing or soldering steps that follow.

Plated Ni metallurgy on the refractory metal is one way of making a solderable/brazable surface. Ni can be plated in two ways, either by electroplating or by electroless plating. Electroless plating has the advantage that not all the features need to be electrically connected in order to perform the plating. Plating from an electroless bath tends to incorporate some of the Ni complex into the film, resulting in a film that is not pure. Following plating, a thermal diffusion step is necessary to provide adhesion to the refractory metal. The impurity of the Ni film precipitates out during the diffusion step as $Ni_3P$, leading to a major problem with the properties of the film. The plated film has high residual stresses, a potential cause of micro-cracks which negatively affect the hermeticity of the package. These precipitates also cause wettability problems. Subsequent cleaning steps tend to remove the Ni, leaving behind $Ni_3P$ precipitates, that result in the formation of "black vias" that are prone to wettability problems thereinafter.

Another bath that can also be advantageously used for electroless plating is one containing a Ni amine-boron complex. This bath co-deposits some of the boron alongside the Ni. Such a bath has several advantages over the hypophosphite previously described. The Ni diffusion which promotes adhesion between the refractory metal results in a low stress film which solves the micro-cracking problem. Boron precipitates as $Ni_3B$ at about 400° C. during the early stages of the diffusion. However, at higher temperatures, $Ni_3B$ dissociates and the boron diffuses into the glass in the underlying feature. Glass is required, as will be described hereinafter, to eliminate boron from the Ni film. This dissociation at higher temperatures leads to a clean film made of Ni only, with a substantial improvement in its wettability characteristics over a film produced using the hypophosphite bath described above.

The use of glass for eliminating boron from the Ni film and for improving the quality of electrolessly deposited layer of Ni is described by Fleming et al. in U.S. Pat. No. 4,407,860. More particularly, a bath containing an amine-boron autocatalytic reducing agent on a surface containing glass is provided, and the boron containing Ni layer is subsequently heated to a temperature of at least 750° C., long enough to make it possible for the boron to diffuse from the layer into the glass in the substrate.

Referring to FIGS. 1a–1c, there are shown a sequence of metallographic cross-sections of a prior art diffusion nickel film deposited on a molybdenum paste containing glass. Structures of this type are typically diffused at a temperature of 860° C. for 15 minutes.

Initially, a Ni layer is deposited on the surface of a sintered alumina substrate 10. Various patterns are selectively formed into a configuration that is defined either by an underlaying metallurgy pattern, (usually, a screened pattern of the refractory metal), or by activating the area by means of an agent typical of an electroless plating process. The use of the electroless plating technique makes it possible to selectively plate only screened metal areas. The areas to be plated must have glass particles 12 adjacent to the surface, normally ranging from 0.5–15% by weight. The base used for the deposition of the electroless Ni layer 17 includes a screened layer formed of a refractory metal 11, such as W, Mo, Ta, Ti, Mn and glass fruit 12 in an amount ranging from 4–11% by weight. The pattern can be screened on a green sheet and sintered alongside the substrate or, alternatively, it can be screened and sintered on an previously sintered ceramic substrate. In an alternate process, a metallic screened pattern may be formed using a paste devoid of glass frit. However, even in this latter case, glass must be present in the substrate, in order that it migrate to infiltrate the paste pattern in an appropriate amount.

Prior art methodologies include activating the refractory metal surface by dipping the sintered alumina substrate in a bath of $PdCl_2$ for a length of time sufficient to deposit a layer of Pd seed metal on the refractory surface. Following the cleaning process, the substrate is placed in a nickel plating bath (FIG. 1b) containing an amino boron auto catalytic reducing agent and Ni ions to plate a nickel film 17 of desired thickness on the metal features. Preferably, the Ni layer is deposited only on the underlying refractory metal areas. Typically, the Ni layer will contain 0.1–0.7% of boron by weight, leading to a layer having a thickness ranging from 2–15 μm.

The substrate processed in this manner is then heated in an inert atmosphere at a temperature ranging from 750° to 1200° C. The environment can be non-reactive gas, such as He, or Ar, and a reducing atmosphere that includes either $H_2$, a combination of $H_2$ and $N_2$, or a vacuum. The heating step is carried for a time such that it causes the boron in the Ni layer to diffuse downward where it may react or even be held by the glass in the underlying Mo layer. The step of diffusing the plated nickel film produces adhesion to the refractory metal. The above diffusion step produces, initially, a film with $Ni_3B$ precipitates 13. These precipitates are undesirable since they affect the properties of the film and of the solder/braze wetting. Diffusion at high temperatures, i.e., 750° C. and above, enhances the film properties and eliminates boron precipitates from the film by diffusing the boron into the underlying glass inclusions.

Prior art processes suffer from certain serious limitations, not the least in that they are overly restrictive. The step of providing a substrate that includes glass particles adjacent to the surface areas that receives the metal layer is deemed unnecessary. Further, the temperatures commonly used by the prior art techniques are unnecessarily high and add to the cost of manufacturing.

OBJECTS OF THE INVENTION

Accordingly, it is an object of the present invention to remove boron from a Ni layer that was deposited in an amine-boron autocatalytic bath process.

It is another object of the invention to electrolessly plate a layer of Ni on a surface containing metal features, wherein the diffusion is performed in a reducing atmosphere containing nitrogen.

It is yet another object of the invention to reduce the minimum temperature to diffuse a nickel film to a temperature as low as 500° C. for a duration of time consistent with the kinetic data, to ensure complete diffusion of the Ni film and to remove at least 95% of the boron.

It is a further object of the invention to deposit a free-standing film of Ni on a sintered ceramic substrate provided with refractory metal features without requiring that the film be plated on a glass containing refractory metal for the boron to diffuse into the glass for its subsequent removal.

It is still another object of the invention to ensure that the diffusion is performed in a non-oxidizing environment.

SUMMARY OF THE INVENTION

In accordance with one aspect of the present invention, there is provided an improved process for producing an electrolessly deposited layer of Ni, yielding a clean Ni film having a wettable surface, wherein the diffusion occurs in a reducing gas containing $N_2$, with a reduced diffusion temperature lowered by more than 150° C. over prior art processes, namely, as low as 500° C.

In accordance with another aspect of the present invention, the presence of $N_2$ during diffusion changes the direction of the outgoing boron away from the surface of the film, thereby eliminating the requirement that the film be plated on a glass containing refractory metal for the boron to diffuse into the glass for its subsequent removal.

In accordance with yet another aspect of the present invention, there is described a process for providing a low-stress layer of nickel on a substrate containing metal features, the process including the steps of: depositing a layer of nickel-boron on selected glass-free metalized areas on the substrate; and heating the resultant substrate and nickel-boron layer in a non-oxidizing environment, the heating being performed at a temperature of at least 500° C. to diffuse the boron away from the nickel-boron layer.

BRIEF DESCRIPTION OF THE DRAWINGS

While the specification concludes with claims particularly pointing out and distinctly claiming what is regarded as the present invention, details of a preferred embodiment of the invention may be more readily ascertained from the technical description when read in conjunction with the accompanying drawings wherein:

DETAILED DESCRIPTION OF THE PRESENT INVENTION

Figure 1A:
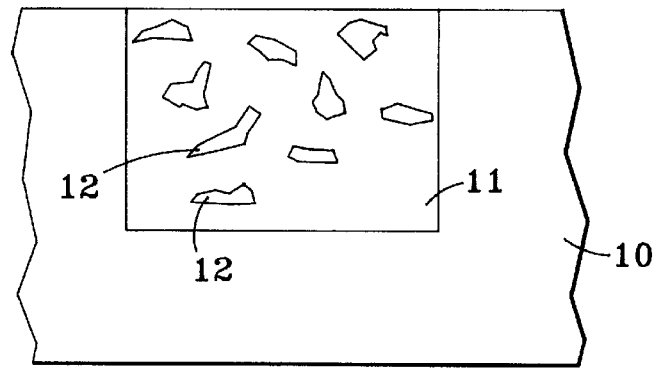
FIGS. 1a, 1b and 1c illustrate various metallographic prior art cross-sections of a nickel film deposited on a molybdenum paste containing glass.
Figure 1B:
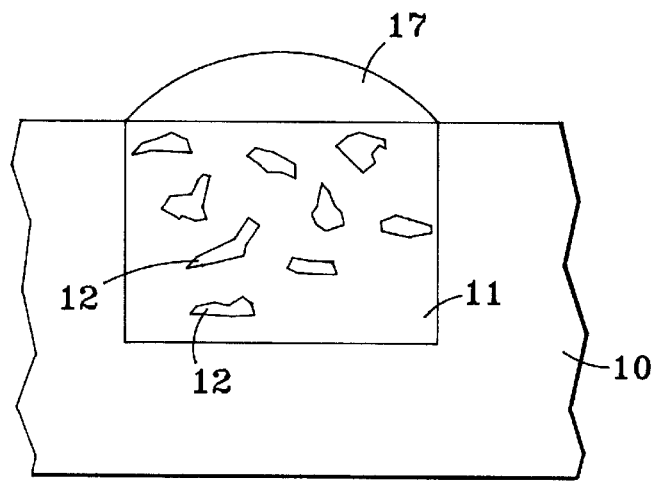
Figure 1C:
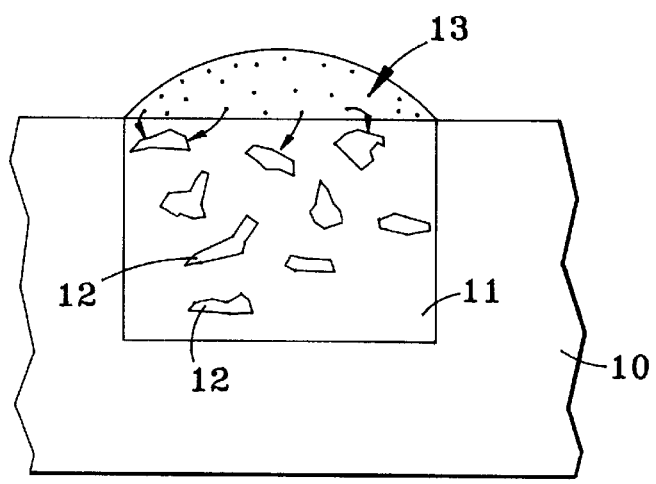
Figure 2A:
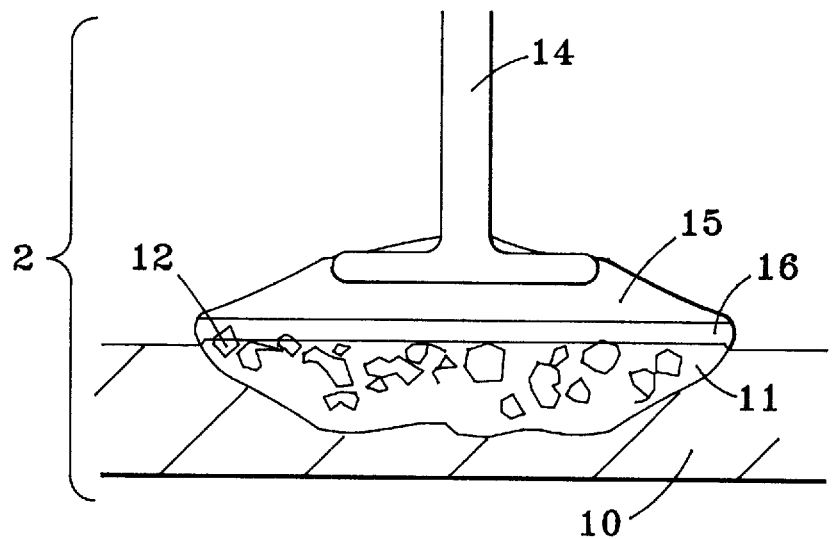
FIGS. 2a, 2b, 2c and 2d show a preferred embodiment of the present invention, wherein a metal pin is brazed to a sintered ceramic substrate using the process steps of the present invention.

Referring now to FIG. 2a, there is shown a substrate 10 having a metal pin 14 brazed to a metal assembly 2. This substrate 10 is preferably made of sintered alumina. On the substrate is shown a refractory metal base 11 plated with a layer of nickel 16 to improve wettability. The plated layer of nickel 16 was deposited and diffused using prior art techniques previously described or the process described in the present invention. The metal pin 14 is brazed to metal base 11, preferably, with eutectic copper-silver braze 15. Eutectic copper-silver braze melts at 778° C., a temperature which practitioners will recognize as being too low for the nickel to diffuse by prior art.

After completing the pin brazing, the exposed metal of the final assembly 2 that includes the metal base 11, the pin 14, the copper-silver braze 15, and the Ni layer 16, requires an additional coating of nickel to protect it from corrosion. In accordance with an important aspect of the present invention, it is noted that the braze 15 is devoid of any glass inclusions 12 into which the boron could possibly diffuse.

Figure 2B:
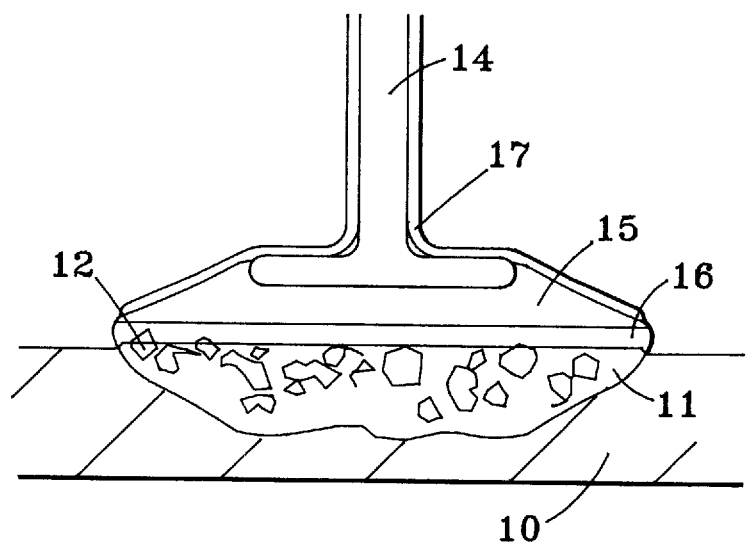

The sequence of steps leading to a pin assembly leading to Ni plating and subsequent Ni diffusion are as follows:

The refractory metal surface is activated by dipping the substrate 10 in a bath of $PdCl_2$ to deposit a layer of Pd seed metal on the surface. Subsequent to the activation step and following appropriate cleaning steps (e.g., an HCl rinse and a water rinse), the substrate is placed in a nickel plating bath containing an amine-boron autocatalytic reducing agent to plate Ni film 17 to a desired thickness (e.g., 4.5 microns) on the metal features, as illustrated in FIG. 2b.

Figure 2C:
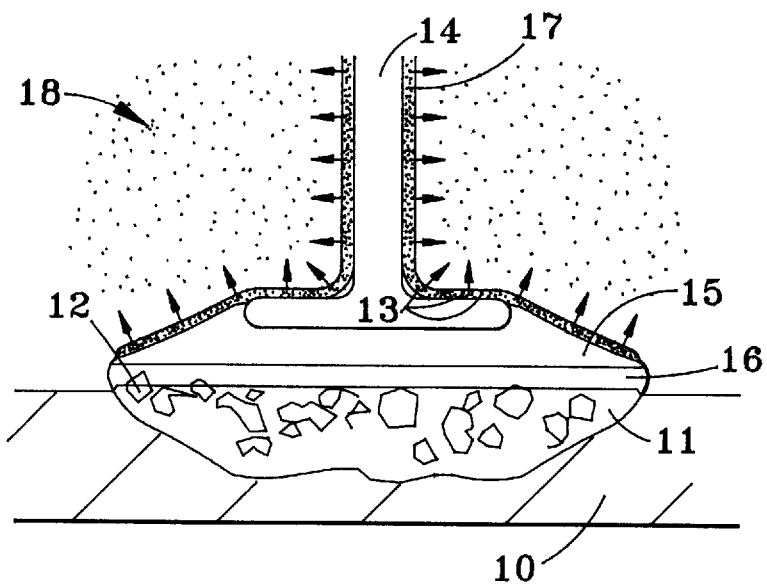
Figure 3:
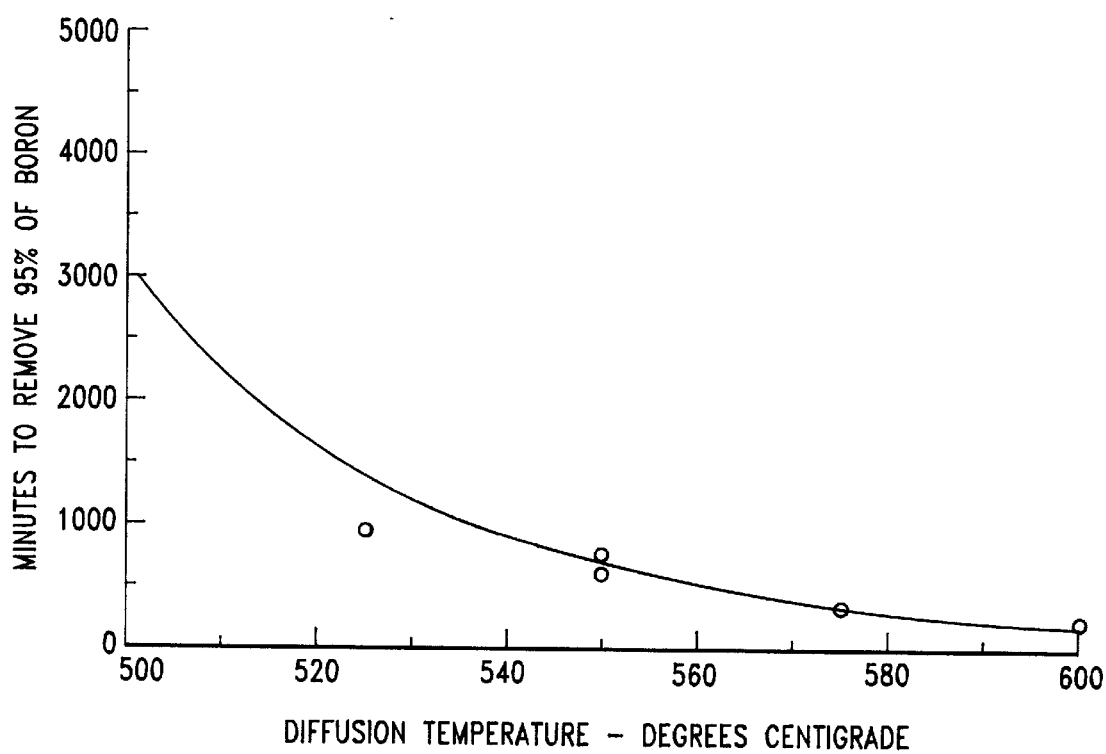
FIG. 3 is a plot of the time required to remove 95% of the boron vs. diffusion temperature.

The plated Ni film 17 is then diffused to produce adhesion to the refractory metal, as shown in FIG. 2c. The diffusion is performed in a reducing atmosphere containing $N_2$ 18. Mixtures of gases, e.g., $N_2$ and $H_2$ in any proportion would, likewise, also be acceptable. Indeed, any nonoxidizing gas atmosphere containing $N_2$ could be used with equal success. The diffusion allows the $Ni_3B$ precipitates 13 to dissociate and diffuse through the Ni surface 17. Concurrent with the diffusion process, bonding of the Ni to the underlying metal feature occurs. The optimum timing at temperature of diffusion (removal of the boron and bonding to the metal) is determined from FIG. 3 in the following manner. First, the temperature at which diffusion is to take place is selected. This temperature is selected with due consideration of the operating characteristics of the furnace and the temperature sensitivity of the substrate. For a eutectic copper-silver braze, the optimum temperature is approximately 650° C., which is significantly below its melting point. The exact diffusion time, as read from FIG. 3, is 234 minutes (approximately, 3.9 hours). Thus, the assembly is diffused in a $N_2$ containing atmosphere at 650° C for 3.9 hours. The boron diffuses into the furnace atmosphere as indicated by the arrows in FIG. 2c.

Practitioners of the art will fully realize that higher temperatures may be required for other types of brazing, e.g., pure silver, which may require temperatures in excess of 1000° C. Higher melting copper-silver brazes would also allow higher Ni diffusion temperatures. However, in the preferred embodiment of the present invention, eutectic copper-silver brazer was selected to conform to other considerations, e.g., customer requirements, which did not allow for high diffusion temperatures.

Figure 2D:
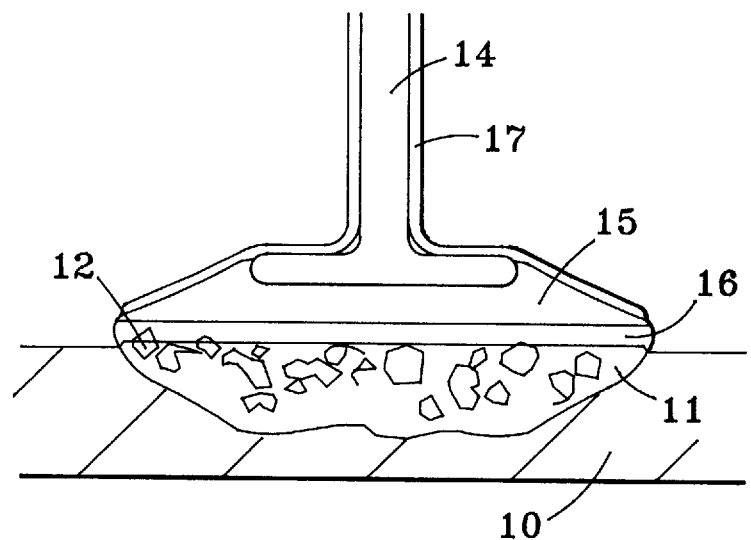

The finished product is schematically shown in FIG. 2d. The outermost protective layer of nickel 17 is low stress and free of nickel boride precipitates, (the low stress being characteristic of a boron free nickel film).

The plot shown in FIG. 3 was achieved by conducting kinetics experiments on a module containing nickel plated metal features, driven by the failure to diffuse nickel plated upon amzirc, i.e., copper-zirconium (99.5% Cu and 0.5% Zr) pins.

A kinetic study of the above process was performed by diffusing a Ni film at 400° C., and holding various samples at different temperatures in a forming gas atmosphere. The disappearance of $Ni_3B$ was analyzed using X-ray diffraction. The resulting data was fit to a Johnson-Mehl relationship. The length of time for the diffusion to take place at various temperatures was performed, maintaining as the sole criteria that 95% of the $Ni_3B$ be removed from the sample. The final results of this analysis are shown graphically in FIG. 3. At any given diffusion temperature, holding the work-piece at a temperature less than the prescribed time will result in an incomplete diffusion of the Ni film. Holding the sample for a longer time is unnecessary and uneconomical.

Figure 4:
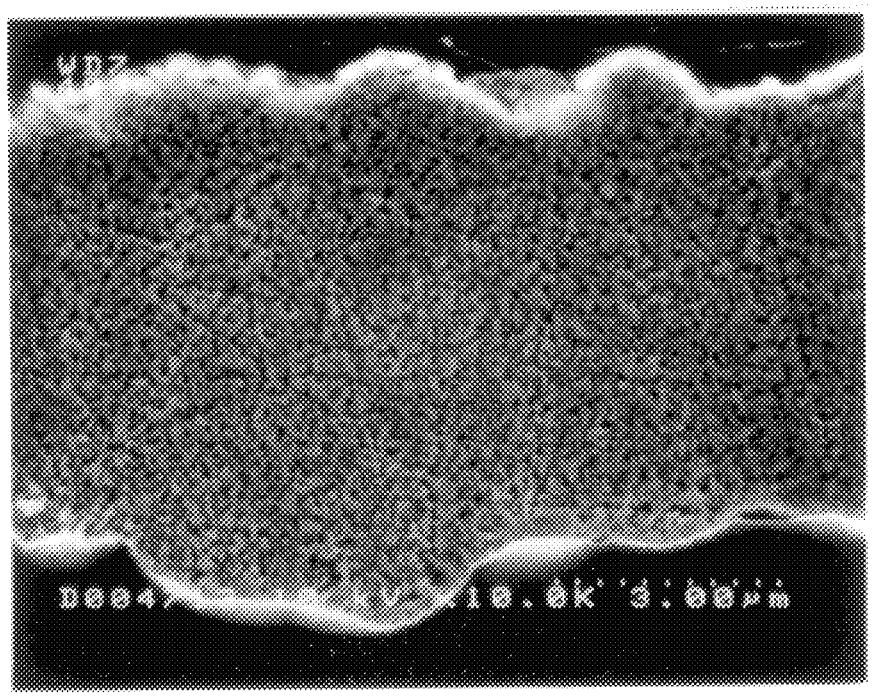
FIG. 4 illustrates a metallurgical cross-section of a lightly etched nickel film heated at 400° C. for 15 minutes, that was plated onto and subsequently removed from a molybdenum sheet, in accordance with the process of the present invention.

Referring now to FIG. 4, a metallurgical cross-section of a lightly etched nickel film is shown after being heated at 400° C. for 15 minutes. The film was first plated onto and subsequently removed from a molybdenum sheet. The thickness of the Ni layer 100 shown is approximately 8 μm. The dark spots seen on the photograph are $Ni_3B$ precipitates. The precipitates are precisely those that need to be removed using the method described above.

Figure 5:
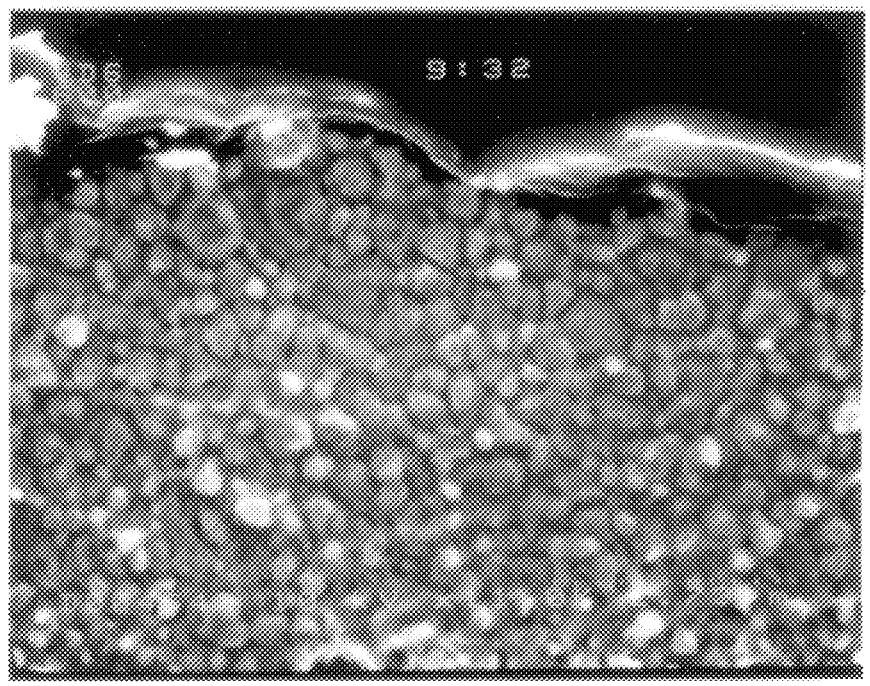
FIG. 5 illustrates a metallurgical cross-section of the film shown in FIG. 4 after heating it at 600° C. for four hours.

Finally, referring to FIG. 5, the etched metallurgical cross-section of the film of FIG. 4 is shown after heating the nickel film at 600° C. for four hours. As shown in the photograph, the precipitates have by now been totally removed, leaving a stress-free Ni film of larger grain size.

While the invention has been described with reference to a preferred embodiment thereof, it is to be understood that the method of the invention is not limited to the precise details and conditions disclosed and that various changes and modifications, in particular to applications others that a brazed pin on a sintered ceramic substrate, may be made therein without departing from the spirit of the invention which is defined by the claims that follow.

What is claimed is:

1. A process of providing a microcrack free layer of nickel on a substrate provided with metal features, comprising the steps of:

depositing a layer of nickel-boron on selected glass-free metalized areas on said substrate; and heating the resultant substrate and nickel-boron layer in a non-oxidizing environment, said heating diffusing boron away from said nickel-boron layer, said diffusion being performed notwithstanding the absence of glass in said metalized features.

2. The process recited in claim 1, wherein said layer of nickel-boron is deposited by electroless plating.

3. The process recited in claim 1, wherein said non-oxidizing environment comprises a gas mixture containing nitrogen.

4. The process recited in claim 3, wherein said gas mixture is a reducing gas.

5. The process recited in claim 3, wherein said reducing gas is a mixture of gases including at least nitrogen.

6. The process recited in claim 1, wherein the step of depositing includes:

dipping said substrate in a bath of $PdCl_2$ to deposit a layer of Pd on said metalized areas;

dipping said substrate into a nickel plating bath provided with an amine-boron autocatalytic reducing agent to plate said nickel-boron layer; and diffusing said plated nickel-boron layer to produce adhesion to a refractory metal and to remove boron from said plated nickel-boron layer.

7. The process recited in claim 1, wherein said substrate is a sintered ceramic substrate.

8. The process recited in claim 1, wherein said heating is continued until said diffusion is completed and until at least 95% of the boron is removed.

9. The process recited in claim 1, wherein said heating is performed at temperatures selected from the group consisting of 525° C. for a duration of 950 minutes, 550° C. for 700 minutes, 575° C. for 400 minutes and 600° C. for 300 minutes.

10. A process of providing a microcrack free layer of nickel on a substrate provided with metal features, comprising the steps of:

depositing a layer of nickel-boron on said metal features on said surface;

heating the resultant surface and nickel-boron layer in a non-oxidizing environment, said heating being performed at a temperature of at least 500° C. to diffuse said boron away from said nickel-boron layer, said diffusion being performed notwithstanding the absence of glass in said metalized features.

11. The process recited in claim 10, wherein said heating is performed at temperatures selected from the group consisting of 525° C. for a duration of 950 minutes, 550° C. for 700 minutes, 575° C. for 400 minutes and 600° C. for 300 minutes.

12. The process recited in claim 10, wherein said surface is glass-free.

13. A process of providing a microcrack free layer of nickel on a substrate provided with metal features, comprising the steps of:

depositing a layer of nickel-boron on said metal features on said surface;

said heating being performed at a temperature ranging from 500° C. to 750° C. to diffuse said boron away from said nickel-boron layer, said diffusion being performed in the absence of glass in said metalized features.

14. A process of providing a microcrack free layer of nickel on a substrate provided with metal features, comprising the steps of:

depositing a layer of nickel-boron on said metal features on said surface;

depositing a nickel layer on top of said layer of nickel-boron;

heating the resultant substrate, nickel-boron layer and nickel layer in a non-oxidizing environment, said heating being performed at a temperature ranging from 500° C. to 750° C. to diffuse said boron away from said nickel-boron layer, said diffusion being performed notwithstanding the absence of glass in said metalized features.

* * * * *